(12) United States Patent
Kelkar

(10) Patent No.: US 7,420,280 B1
(45) Date of Patent: Sep. 2, 2008

(54) REDUCED STRESS UNDER BUMP METALLIZATION STRUCTURE

(75) Inventor: Nikhil V. Kelkar, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 316 days.

(21) Appl. No.: 11/120,841

(22) Filed: May 2, 2005

(51) Int. Cl.
*H01L 23/48* (2006.01)

(52) U.S. Cl. .............. 257/773; 257/738; 257/780; 257/781; 257/782; 257/784; 257/E21.508; 257/E21.627; 257/E21.641

(58) Field of Classification Search ........... 257/664, 257/665, 734–786, E29.111–E29.165, E23.01–E23.079, 257/E23.141–E23.179, E21.135–E21.21, 257/E21.627, E21.641
See application file for complete search history.

(56) References Cited

U.S. PATENT DOCUMENTS

| | | | |
|---|---|---|---|
| 6,492,692 B1 * | 12/2002 | Ishii et al. ............. | 257/408 |
| 6,577,017 B1 * | 6/2003 | Wong ................. | 257/786 |
| 6,841,872 B1 * | 1/2005 | Ha et al. .............. | 257/736 |
| 7,034,402 B1 | 4/2006 | Seshan | |
| 2003/0011072 A1 * | 1/2003 | Shinogi et al. .......... | 257/737 |
| 2005/0116340 A1 | 6/2005 | Shindo | |
| 2007/0164453 A1 * | 7/2007 | Lee et al. ............. | 257/780 |
| 2007/0273031 A1 * | 11/2007 | Lee et al. ............. | 257/759 |

\* cited by examiner

*Primary Examiner*—Jasmine J Clark
(74) *Attorney, Agent, or Firm*—Beyer Law Group LLP

(57) ABSTRACT

An improved under bump structure for use in semiconductor devices is described. The under bump structure includes a passivation layer having a plurality of vias. The vias are positioned such that a plurality of vias are associated with (i.e., located over) each contact pad. A metal layer fills the vias and forms a metallization pad that is suitable for supporting a solder bump. Preferably the metal layer extends over at least portions of the passivation layer to form a unified under bump metallization pad over the associated contact pad. Each metallization pad is electrically connected to the contact pad through a plurality of the vias. The described under bump structures can be formed at the wafer level.

18 Claims, 4 Drawing Sheets

REDUCED STRESS UNDER BUMP METALLIZATION STRUCTURE

BACKGROUND

This invention relates to packaging of integrated circuits in packages with bump interconnects.

There are a number of conventional processes for packaging integrated circuits. Many packaging techniques use solder bumps onto associated I/O contact pads formed on an active face of a die to provide electrical interconnects to external devices. The die is then typically attached to a suitable substrate, such as a printed circuit board ("PCB"), such that the solder bumps on the die are surface mounted to contact pads on the substrate. The solder bumps are then typically reflowed to form solder joint connections between the substrate and the attached die. Such a surface mount device ("SMD") is often referred to as "wafer level chip scale package," such as micro-SMD, wherein the die must be "flipped" to place its active surface containing solder bumps into contact with the substrate to which the chip is to be attached.

Various problems can occur when connecting a solder bump to a contact pad, such as issues with wetting, adhesion, temperature cycling induced stresses, and the electrical isolation needs. Often these problems are addressed by providing additional items between the solder bump and the contact pad. Such items can include, for example, under bump metallization ("UBM") stacks. For purposes of efficiency, these items are all typically formed onto dice at the wafer level prior to separation. Many such formation processes are generally known to those skilled in the art. Contact pads are usually formed first onto an active surface of a wafer. Next, one or more passivation and/or resilient layers having individual vias corresponding to individual contact pads are added. A UBM stack is then formed over each contact pad (within the vias), such that the bottom of each UBM stack contacts its associated contact pad or an electrical connector to the contact pad.

A common UBM structure is an electroless nickel-gold (Ni—Au) UBM. Solder bumping of ICs having aluminum bond pads requires removing the insulating aluminum oxide layer from the bond pad surface and making good electrical connection to the underlying metal. In the Ni—Au process, oxide removal and surface activation is commonly done through zinc displacement plating, using a zincate solution. The bump is then formed by selective electroless plating of nickel in a wet chemical maskless process. Typically, prior to zincation, the wafer is pre-cleaned and the wafer backside is covered by a protective layer of resist. Electroless Ni—Au plating also requires that all exposed material other than the contact pads be passivated or covered with resist. The zincation process removes the aluminum oxide and replaces it with a thin layer of zinc. After zincation, nickel is deposited from a hypophosphate-based nickel bath. The thickness of the deposited nickel depends on the plating time, with typical deposition rates of 20-25 micrometers per hour. Finally, a thin layer of immersion gold is plated over the nickel to protect the surface from oxidizing. FIG. 4A shows a cross-section drawing of a typical prior art electroless Ni—Au UBM structure (400). The central layer (410) is the final metal pad. The electroless nickel (420) deposits in the passivation (430) opening, and widens over the top of the passivation (430) as the nickel bump height increases. The thin gold plating is not shown in FIG. 4A. As can be seen in FIG. 4A, there is only one big opening or via in the passivation (430). A schematic top view of the via is shown in FIG. 4B.

Since the electroless NiAu UBM is a mask-less process, the manufacturing cost is lower. However, the ion exchange and temperature cycling that occur during the creation of the UBM structure typically result in intrinsic and extrinsic residual stresses, respectively, in the UBM structure. These stresses may result in pad delamination and/or silicon catering, due to the low compliance of silicon. Thus, although existing UBM structures work well in many situations, there are ongoing efforts to further improve the UBM structures used in various integrated circuit devices, such that problems like those described above are minimized or eliminated.

SUMMARY

To achieve the foregoing and other objects of the invention, an improved under bump structure for use in semiconductor devices is described. The under bump structure includes a passivation layer having a plurality of vias. The vias are positioned such that several vias are associated with (i.e., located over) each contact pad. A metal layer fills the vias and forms a metallization pad that is suitable for supporting a solder bump. Preferably the metal layer extends over at least portions of the passivation layer to form a unified under bump metallization pad over the associated contact pad. Each metallization pad is electrically connected to the contact pad through a plurality of the vias.

The thickness of the metal layer may be widely varied. In some embodiments, the metal layer has a thickness above the contact pads in the range of about 2-15 micrometers. The geometry and spacing of the vias may also be widely varied. By way of example, in some embodiments, the maximum spacing between two adjacent vias associated with the same contact pad is no more than about twice the thickness of the metal layer above the passivation layer. The geometry of the vias may take any suitable form including, by way of example, substantially circular, square, hexagonal, octagonal and/or customer cross sectional shapes.

The passivation layer and the metal layer may be formed from a wide variety of materials. By way of example, the passivation layer may be formed from a conventional insulating material used in semiconductor applications such as silicon dioxide or silicon nitride. A wide variety of materials or stacks of materials may be used to form the metal layer. By way of example, the described arrangement works very well with Nickel/Gold metallization stacks.

The described under bump structures can be formed at the wafer level. In a method aspect of the invention, a passivation layer is deposited over the contact pads formed on an active surface of a wafer. Vias are then formed through the passivation layer such that a plurality of different vias overlay and expose portions of the same contact pad. A metallization pad is then formed over each contact pad. The metallization pad fills the vias and overlies portions of the passivation layers so that a unified metallization pad is formed that is electrically connected to the contact pad through a plurality of the vias.

The details of one or more embodiments of the invention are set forth in the accompanying drawings and the description below. Other features, objects, and advantages of the invention will be apparent from the description and drawings, and from the claims.

DETAILED DESCRIPTION

Figure 1A:
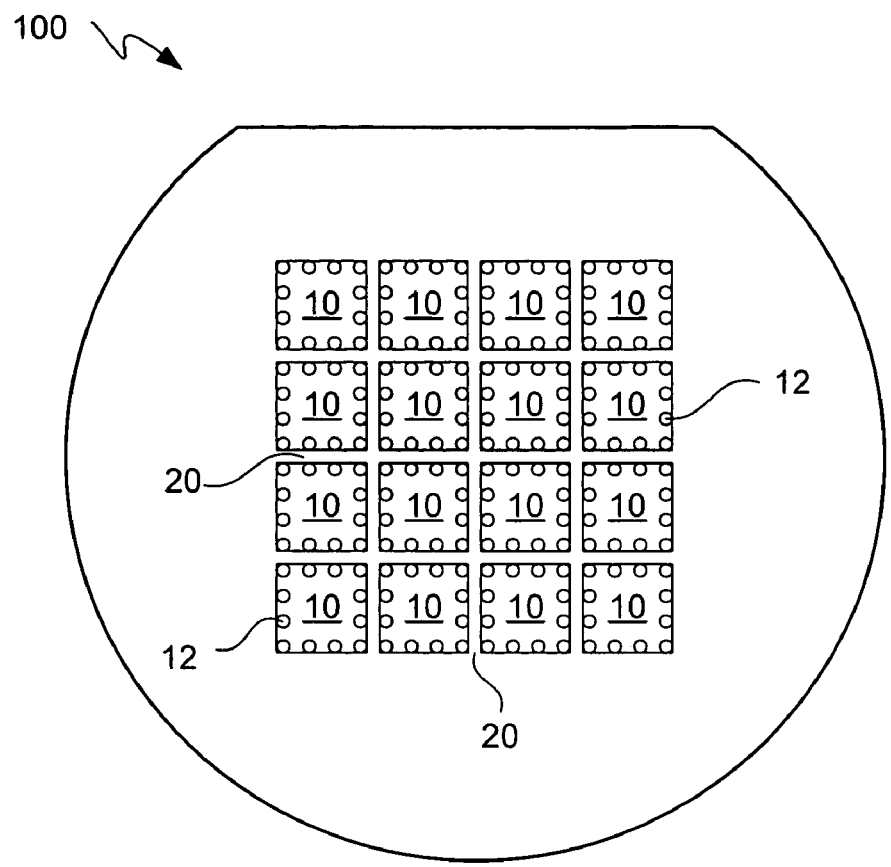
FIG. 1A shows a top plan view an exemplary wafer comprising multiple surface mount semiconductor dice.

FIG. 1A shows a top plan view of an exemplary wafer (100) including multiple surface mount semiconductor dice (10), separated by horizontal and vertical scribe lines (20). Each of the dice (10) includes several solder contacts (12), which can be mounted to contact pads of a substrate such as a printed circuit board (PCB). It should be noted that while only a relatively small number of dice (10) are shown on the wafer (100) for purposes of illustration, most wafers have significantly more dice formed thereon. By way of example, current state of the art wafers typically have several hundred to several thousand dice formed thereon, and some have more than ten thousand dice. As is well known in the art, most wafers (100) and dice (10) are formed of silicon, although any other appropriate semiconductor material can also be used, including, for example, gallium arsenide (GaAs), Indium Gallium Phosphide, Silicon Germanium, and the like.

Figure 1B:
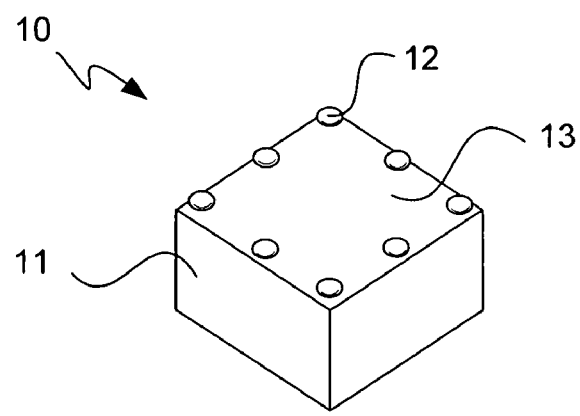
FIG. 1B shows a top perspective view a surface mount semiconductor die scribed from the wafer of FIG. 1A.

FIG. 1B shows a top perspective view of one possible embodiment of an individual semiconductor die (10) scribed from the wafer (100) of FIG. 1A. After the wafer 1 is fabricated and solder contacts, typically referred to as "balls" or "bumps" (12), are formed thereon, a dicing machine is used to create the individual dice (10) by sawing or otherwise cutting the wafer (100) along the scribe lines (20). Each die (10) preferably has a body (11) and several solder bumps (12) formed on an active face (13). Also, although only one "row" or "ring" of solder bumps is provided on the die of FIG. 1B, other contact patterns including, for example, multiple rows, multiple rings, or arrays of contacts may also be provided as desired. For example, it is common for solder bumps (12) to be placed into adjacent rows and columns to form a grid or array. Any and all such shapes, dimensions, formations and patterns of solder contacts (12) are contemplated for use with the present invention.

Figure 2A:
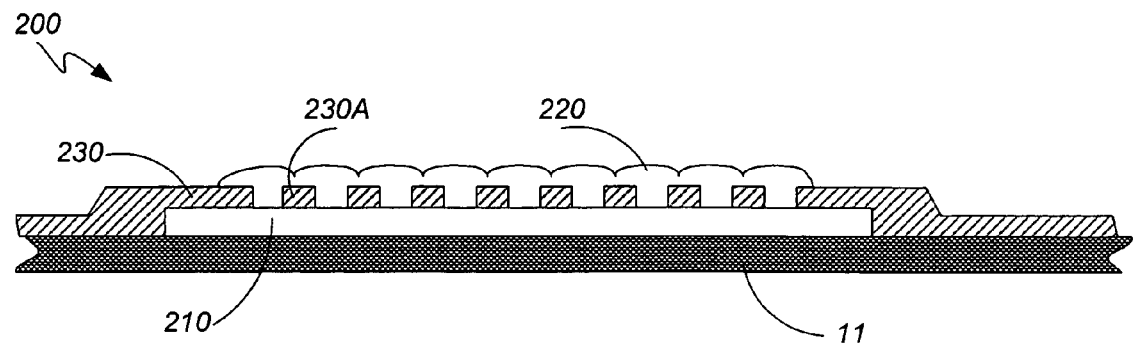
FIG. 2A shows a cross-section drawing of an electroless Ni—Au bump (200) in accordance with one embodiment of the invention.
Figure 4A:
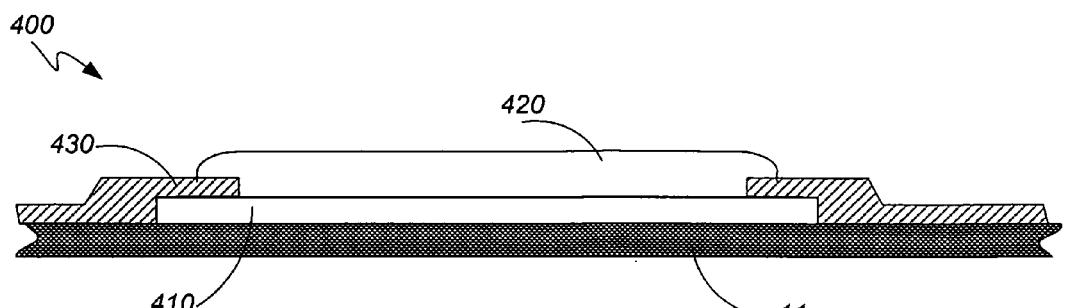
FIG. 4A shows a prior art cross-section drawing of a typical prior art electroless NiAu bump (400).

FIG. 2A shows a cross-section drawing of an electroless Ni—AU UBM structure (200 in accordance with one embodiment of the invention. Just like in FIG. 4A, the central layer is the final metal contact pad (210), and a passivation layer (230) is formed over the exposed top surface of the semiconductor die and contact pads (210). As is generally known, the passivation layer primarily serves as a protective barrier for the semiconductor material, such that any passivation layer is preferably formed from an insulation type material such as silicon dioxide ($SiO_2$) or silicon nitride (SiN).

Figure 2B:
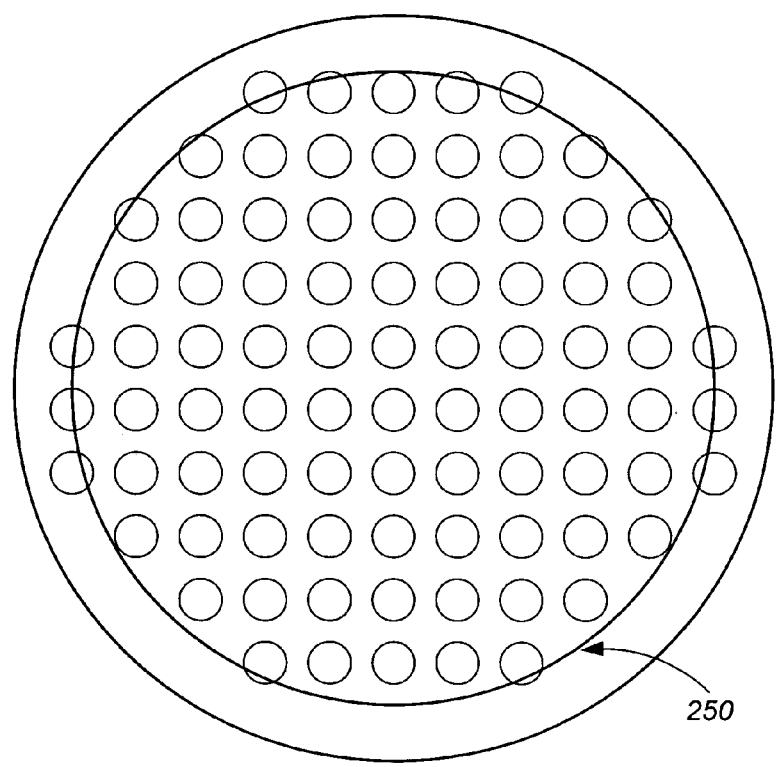
FIG. 2B shows a via array for the vias in the Ni—AU bump (200) of FIG. 2A.
Figure 4B:
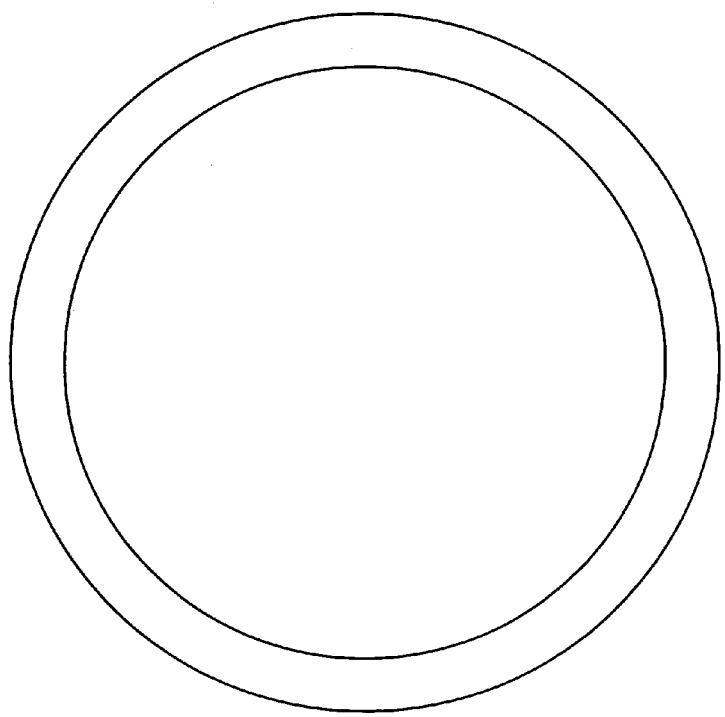
FIG. 4B shows a prior art via array for the vias in the Ni—AU bump (400) of FIG. 4A.

However, instead of having a single large via, as is shown in FIG. 4B, multiple vias are etched or otherwise created within the passivation layer (230) above the contact pad (210) such that at least a portion of the contact pad (210) is exposed. Nickel or some other suitable metal is then deposited, using conventional techniques into the vias, such that a UBM structure is created that extends over the passivation layer in a way similar to the conventional UBM structure disclosed in FIG. 4A. FIG. 2B shows an exemplary via array used to create a UBM structure in accordance with the invention, and will be discussed in more detail below. As a result of reducing the effective dimension of the individual deposited regions, while yet providing a large cumulative UBM area necessary for wafer level chip scale packages (for example, the micro surface mounted device package) the extrinsic and intrinsic stresses in the UBM can be reduced, and the occurrence of pad delamination and/or silicon cratering can be greatly reduced.

As can be seen in FIG. 2A, the deposited nickel forms a layer including a number of "mushroom-like" structures, interspersed by passivation layer sections (230A). Both the nickel (220) and the passivation layer sections (230A) are in contact with the underlying contact pad (210), and together they form the UBM structure. It should be noted that FIG. 2A is not drawn to scale in the horizontal and vertical directions. Typically, the passivation layer (230; 230A) is about 2 micrometers thick, and the height of the "mushroom-like" nickel structures created in the vias extends to about 1-3 micrometers above the top surface of the passivation layer (230; 230A). The opening in the passivation layer (230) over the contact pad (210) is typically about 100-300 micrometers, but can be as small as 2 micrometers, or as large as 400 micrometers.

A top view of one embodiment of the opening (250) and the vias is shown in FIG. 2B. In the illustrated embodiment, the opening (250) is shown as being circular. However, the opening (250) does not have to be circular, but can have any shape upon which a bump can be formed. As can be seen in FIG. 2B, the vias along the perimeter of the opening (250) can be shaped differently from the vias inside the opening, such that the vias along the perimeter conforms to the opening. In the illustrated embodiment, most of the vias have circular cross sections, whereas the vias on the perimeter have a various degrees of convexity or have crescent shaped cross sections.

Figure 3A:
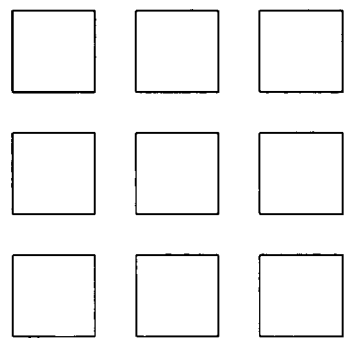
FIG. 3A shows a schematic top plan view of a set of vias with square cross sections, in accordance with the invention.
Figure 3B:
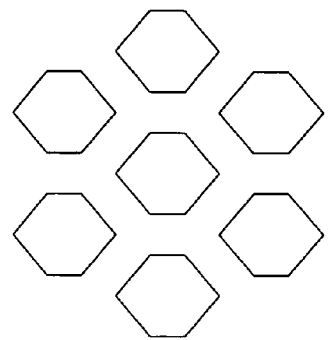
FIG. 3B shows a schematic top plan view of a set of vias with hexagonal cross sections, in accordance with the invention.
Figure 3C:
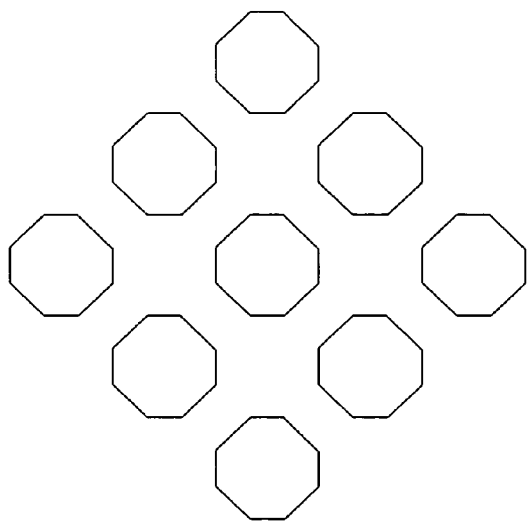
FIG. 3C shows a schematic top plan view of a set of vias with octagonal cross sections, in accordance with the invention.
Figure 3D:
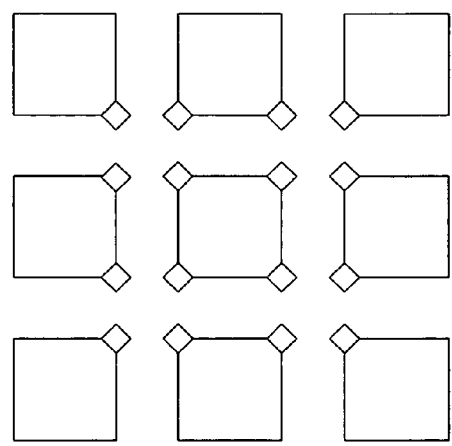
FIG. 3D shows a schematic top plan view of a set of vias with custom cross sections, in accordance with the invention.

In one embodiment, such as the one shown in FIG. 2B, all the vias have essentially identical shape and size of their cross sections. However, it should be realized than the shape and size of the cross sections of the different vias can vary within the same UBM structure. For example, some vias may have a circular cross section, whereas other vias have a square cross section. In some embodiments, the size of the cross sections of the vias can vary, for example, there may be a via having a large cross section in the center of the opening (250) surrounded by a number of vias having small cross sections. Furthermore, although FIG. 2B shows circular cross sections, it should be realized that the cross sections can have many different shapes. For example, FIG. 3A shows a top via of a set of vias with square cross sections, FIG. 3B shows a top view of a set of vias with hexagonal cross sections, FIG. 3C shows a top view of a set of vias with octagonal cross sections, and FIG. 3D shows a top view of asset of vias with custom made cross sections, which will be discussed in further detail below.

The widths (diameters) of the cross sections of the vias may be widely varied. By way of examples, widths in the range of about 2-100 micrometers work well in many applications. Often it is desired to maintain an aspect ratio of at least 1:1 for the cross section of the vias with regards to the thickness of the passivation layer (230). That is, the cross sections of the individual vias need to be at least the size of the thickness of the passivation layer (230). This condition typically determines the lower end of the cross section diameter range. The higher end is directed by the maximum allowable stress for a particular metal layer in a particular application. That is, how much residual stress can be applied to the underlying silicon without the occurrence of pad delamination and/or silicon cratering.

As can be seen in FIG. 2B, in one embodiment the vias are arranged in a grid pattern over the contact pad. Generally, it is preferred that the vias be arranged such that the distance between the centers of any two adjacent vias is the same throughout the entire UBM structure. In one embodiment, the maximum spacing between two adjacent vias is no more than about twice the height of the UBM structure above the passivation layer, with a typical spacing being about the same as the height of the UBM structure above the passivation layer. In many embodiments, the UBM structure typically extends about 2 micrometers above the passivation layer, and thus the spacing between two adjacent vias is typically 2-4 micrometers. However, there are also embodiments in which the UBM extends higher above the passivation layer, and the distance between two adjacent vias can be as large as 12-15 micrometers.

In one embodiment, the distances between the vias is selected such that at any given point on the periphery of a via, the distance to the closest point on the periphery of an adjacent via is approximately the same throughout the UBM structure. This condition can typically not be achieved with vias that have "standard" cross sections and are arranged in a grid pattern, such as the vias with the circular cross sections shown in FIG. 2B, or the vias with the square cross section shown in FIG. 3A. Therefore, the cross sectional shape of the vias need to be modified or customized. FIG. 3D shows a schematic example of such a customized via arrangement. In FIG. 3D, a set of vias with square cross section, such as the set of vias shown in FIG. 3A, has been modified by adding small protrusions on the corners of the vias. As a result, the distance between the perimeters of any two adjacent vias that are located diagonally with respect to each other is the same as the distance between the perimeters of any two adjacent vias that are located horizontally or vertically with respect to each other. It should be noted that the arrangement and shapes of the vias shown in FIG. 3D is just one exemplary arrangement and an exemplary customized shape. Vias having circular, hexagonal, or octagonal cross sections need to be modified in various different ways in order to achieve the above condition.

The semiconductor die described above is particularly suitable for use with small contact pads, such as, contact pads that are used in smart cards and have a size of about 100 micrometers. The dice are also particularly useful in various types of devices that use flip chips. The dice can be used in a range of different types of environments, in particular in environments where the temperature changes are substantial, such as inside car engines, and so on, due to their improved tolerance for stress caused by temperature changes.

A number of embodiments of the invention have been described. Nevertheless, it will be understood that various modifications may be made without departing from the spirit and scope of the invention. For example, although the present invention is primarily described herein as being implemented in flip chip type packages, it should be understood that the present invention may be implemented in any IC package having contact bumps. The invention has been described primarily with reference to an electroless Ni—Au deposition technique, but it should be realized that it is equally applicable to any electro plated or isotropic deposition technique. Also, the invention is not limited to using Ni—Au materials only, but can use a wide variety of materials in order to reduce residual stresses in the deposited mass forming the UBM. The vias have been shown as being arranged in a grid pattern, but it should be realized that it is also possible to arrange the vias in virtually any pattern that provides support for the solder bump and minimizes the resulting stresses. For example, the vias may be arranged in concentric circles or in a honeycomb-like pattern. Accordingly, other embodiments are within the scope of the following claims.

The invention claimed is:

1. A semiconductor die, comprising:
a plurality of contact pads formed on the die;
a plurality of under bump structures, each under bump structure including a metal layer and an uppermost passivation layer having a plurality of vias formed therein, wherein each via extends through the uppermost passivation layer to an associated contact pad such that the plurality of vias are associated with at least some of the contact pads, and wherein the metal layer extends through the vias such that the metal layer is in substantial contact with the associated contact pad, whereby at least some of the contact pads have under bump structures with a plurality of metallized vias; and
a plurality of solder bumps, each solder bump being formed on an associated under bump structure, wherein within each under bump structure, the metal layer extends over at least portions of the passivation layer to form a unified under bump metallization pad over the associated contact pad and wherein a width of the via cross sections is in the range of about 2-100 micrometers.

2. The semiconductor die of claim 1, wherein the metal layer has a maximum thickness above the passivation layer and the maximum spacing between two adjacent vias associated with the same contact pad is no more than about twice the maximum thickness of the metal layer above the passivation layer.

3. The semiconductor die of claim 2, wherein the maximum spacing between adjacent vias associated with the same contact pad is about the same as the maximum thickness of the metal layer above the passivation layer.

4. The semiconductor die of claim 1, wherein the under bump structure has a thickness above the contact pads in the range of about 2-15 micrometers.

5. The semiconductor die of claim 1, wherein the passivation layer is formed from a material selected from the group of: silicon dioxide, silicon nitride, polyimide, and benzocyclobutene (BCB).

6. The semiconductor die of claim 1, wherein the metal layer is made from a material selected from the group of: nickel, palladium, and gold.

7. The semiconductor die of claim 1, wherein the cross sections of all vias have essentially identical shape.

8. The semiconductor die of claim 1, wherein the cross sections of all vias have essentially identical dimensions.

9. The semiconductor die of claim 1, wherein the cross section of at least some of the vias is selected from the group of: a substantially circular cross section, a substantially square cross section, a substantially hexagonal cross section, and a substantially octagonal cross section.

10. The semiconductor fie of claim 1, wherein the distance between the centers of two adjacent vias is the same throughout an under bump structure.

11. A semiconductor wafer comprising a plurality of plurality of dice as described in claim 1.

12. A semiconductor die as recited in claim 1 wherein the metal layer is not part of a wiring layer of the die.

13. A semiconductor die, comprising:

a plurality of contact pads formed on the die;

a plurality of under bump structures, each under bump structure including a metal layer and an uppermost passivation layer having a plurality of vias formed therein, wherein each via extends through the uppermost passivation layer to an associated contact pad such that the plurality of vias are associated with at least some of the contact pads, and wherein the metal layer extends through the vias such that the metal layer is in substantial contact with the associated contact pad, whereby at least some of the contact pads have under bump structures with a plurality of metallized vias; and a plurality of solder bumps, each solder bump being formed on an associated under bump structure wherein the metal layer includes a first sub-layer formed substantially from nickel or nickel alloy and a second sub-layer formed substantially from a gold plating layer deposited on top of the first sub-layer.

14. A semiconductor die, comprising:

a plurality of contact pads formed on the die;

a plurality of under bump structures, each under bump structure including a metal layer and an uppermost passivation layer having a plurality of vias formed therein wherein each via extends through the uppermost passivation layer to an associated contact pad such that the plurality of vias are associated with at least some of the contact pads, and wherein the metal layer extends through the vias such that the metal layer is in substantial contact with the associated contact pad, whereby at least some of the contact pads have under bump structures with a plurality of metallized vias; and a plurality of solder bumps, each solder bump being formed on an associated under bump structure, wherein within each under bump structure, the metal layer extends over at least portions of the passivation layer to form a unified under bump metallization pad over the associated contact pad and wherein the vias in each under bump structure are arranged in a grid pattern in a region over the contact pad.

15. The semiconductor die of claim 14 wherein the region, in a plane parallel to the contact pad, has a perimeter selected from the group consisting of: a substantially circular perimeter, a substantially square perimeter, a substantially hexagonal perimeter, a substantially octagonal perimeter, and a perimeter having the shape of a multi-sided polygon approaching a circular perimeter.

16. The semiconductor die of claim 15 wherein the vias located at the substantially circular perimeter are shaped so as to not extend outside the circular perimeter.

17. The semiconductor die of claim 15, wherein the diameter of the substantially circular perimeter is in the range of about 100-300 micrometers.

18. A semiconductor die as recited in claim 14 wherein the plurality of vias have base structures and protrusions extending from the base structures such that a first distance between the protrusions of any two adjacent vias that are located diagonally with respect to one another is equal to a second distance between the parameters of the base structures of any two adjacent vias that are located horizontally or vertically with respect to one another.

* * * * *

UNITED STATES PATENT AND TRADEMARK OFFICE
CERTIFICATE OF CORRECTION

PATENT NO.        : 7,420,280 B1                                    Page 1 of 1
APPLICATION NO.   : 11/120841
DATED             : September 2, 2008
INVENTOR(S)       : Nikhil V. Kelkar It is certified that error appears in the above-identified patent and that said Letters Patent is hereby corrected as shown below:

SPECIFICATION:

Col. 2, lines 6-7,        change "catering" to --cratering--.

Col. 2, line 37,          change "customer" to --custom--.

Col. 3, line 65,          change "dioxde" to --dioxide--.

Col. 4, line 45,          change "than" to --that--.

Col. 4, line 55,          change "via" to --view--.

In the Claims:

Claim 10, line 1,         change "fie" to --die--.

Signed and Sealed this

Thirtieth Day of June, 2009

JOHN DOLL
*Acting Director of the United States Patent and Trademark Office*

UNITED STATES PATENT AND TRADEMARK OFFICE
CERTIFICATE OF CORRECTION

PATENT NO.        : 7,420,280 B1                              Page 1 of 1
APPLICATION NO.   : 11/120841
DATED             : September 2, 2008
INVENTOR(S)       : Nikhil V. Kelkar It is certified that error appears in the above-identified patent and that said Letters Patent is hereby corrected as shown below:

SPECIFICATION:

Col. 2, lines 6-7,         change "catering" to --cratering--.

Col. 2, line 37,           change "customer" to --custom--.

Col. 3, line 65,           change "dioxde" to --dioxide--.

Col. 4, line 45,           change "than" to --that--.

Col. 4, line 55,           change "via" to --view--.

In the Claims:

Column 6, Claim 10, line 63,    change "fie" to --die--.

This certificate supersedes the Certificate of Correction issued June 30, 2009.

Signed and Sealed this

Twenty-eighth Day of July, 2009

JOHN DOLL
*Acting Director of the United States Patent and Trademark Office*